US009297844B2

(12) United States Patent
Petrucci et al.

(10) Patent No.: US 9,297,844 B2
(45) Date of Patent: Mar. 29, 2016

(54) ANTENNA MAST DETECTION METHODS AND SYSTEMS

(71) Applicant: GM GLOBAL TECHNOLOGY OPERATIONS LLC, Detroit, MI (US)

(72) Inventors: David R. Petrucci, Warren, MI (US); Gregg R. Kittinger, Pontiac, MI (US); Duane S. Carper, Davison, MI (US); Douglas C. Martin, Oxford, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 218 days.

(21) Appl. No.: 13/868,832

(22) Filed: Apr. 23, 2013

(65) Prior Publication Data
US 2014/0055307 A1   Feb. 27, 2014

Related U.S. Application Data

(60) Provisional application No. 61/693,094, filed on Aug. 24, 2012.

(51) Int. Cl.
*G01R 31/00* (2006.01)
*H01Q 1/12* (2006.01)
*H01Q 1/32* (2006.01)

(52) U.S. Cl.
CPC ............. *G01R 31/006* (2013.01); *H01Q 1/12* (2013.01); *H01Q 1/1214* (2013.01); *H01Q 1/3275* (2013.01)

(58) Field of Classification Search
CPC . H01Q 1/3233; H01Q 1/3275; G01R 19/145; G01R 19/155; G01R 29/12
USPC ............... 343/711–717, 894; 340/567, 568.1, 340/657–664
See application file for complete search history.

(56) References Cited

U.S. PATENT DOCUMENTS 4,137,521 A * 1/1979 Martinez .................. 340/426.34
4,293,860 A * 10/1981 Iwata ............................ 343/715
5,943,609 A   8/1999 Ericson et al.
(Continued)

FOREIGN PATENT DOCUMENTS

CN   1837839 A   9/2006
CN   1873436 A   12/2006
(Continued)

OTHER PUBLICATIONS

State Intellectual Property Office of the People's Republic of China, Office Action for Chinese Patent Application No. 201310372784.6 mailed May 5, 2015.
USPTO, Office Action for U.S. Appl. No. 13/868,783 mailed Apr. 10, 2015.
State Intellectual Property Office of the People's Republic of China, Office Action for Chinese Patent Application No. 201310372676.9 mailed Sep. 25, 2015.
(Continued)

*Primary Examiner* — Robert Karacsony
*Assistant Examiner* — Daniel J Munoz
(74) *Attorney, Agent, or Firm* — Ingrassia Fisher & Lorenz, P.C.

(57) ABSTRACT

Methods and systems are provided for detecting whether at least one of an antenna mast and a detection mechanism is installed to an antenna. In one embodiment, a method includes monitoring at least one of amplitude modulation (AM) band data and direct current (DC) power data of the antenna; and selectively determining whether at least one of the antenna mast and the detection mechanism is installed based on the at least one of the AM band data and the DC power data.

20 Claims, 5 Drawing Sheets

(56) References Cited

U.S. PATENT DOCUMENTS

| | | | |
|---|---|---|---|
| 6,275,194 B1 | 8/2001 | Ansorge | |
| 6,509,878 B1* | 1/2003 | Tornatta et al. | 343/715 |
| 2004/0257284 A1* | 12/2004 | Rada et al. | 343/702 |
| 2005/0085951 A1 | 4/2005 | Walker et al. | |
| 2006/0094368 A1* | 5/2006 | Lee et al. | 455/67.13 |
| 2008/0198077 A1 | 8/2008 | Duzdar et al. | |
| 2011/0287820 A1* | 11/2011 | Harrison et al. | 455/575.7 |
| 2014/0055320 A1 | 2/2014 | Petrucci et al. | |

FOREIGN PATENT DOCUMENTS

| | | |
|---|---|---|
| CN | 101741482 A | 6/2010 |
| CN | 202134651 U | 2/2012 |
| WO | 9524059 A2 | 9/1995 |

OTHER PUBLICATIONS

USPTO, Notice of Allowance and Fee(s) Due in U.S. Appl. No. 13/868,783 mailed Oct. 22, 2015.

USPTO, Response to Office Action in U.S. Appl. No. 13/868,783 mailed Jul. 14, 2015.

USPTO, Notice of Allowance and Fee(s) Due in U.S. Appl. No. 13/868,810 mailed Jan. 7, 2016.

State Intellectual Property Office of the People's Republic of China, Office Action in Chinese Patent Application No. 201310372784.6 mailed Dec. 28, 2015.

State Intellectual Property Office of the People's Republic of China, Office Action in Chinese Patent Application No. 201310372769.1 mailed Jan. 5, 2016.

\* cited by examiner

ANTENNA MAST DETECTION METHODS AND SYSTEMS

CROSS-REFERENCE TO RELATED APPLICATION

This application claims the benefit of U.S. provisional patent application Ser. No. 61/693,094, filed Aug. 24, 2012, which is hereby incorporated by reference in its entirety.

TECHNICAL FIELD

The technical field generally relates to vehicle antennas, and more particularly relates to methods and systems for detecting the installation of an antenna mast on the vehicle.

BACKGROUND

Some vehicle antennas are installed by a dealer after production and prior to delivering the vehicle to a customer. These antennas include antenna masts that couple to an antenna receiver of the vehicle. The antenna mast is typically loose shipped with the vehicle. A removable shipping cap is placed on the loose shipped antenna mast to protect antenna threads that couple to the receiver.

In some cases, the dealer can forget to install the antenna mast before delivering the vehicle to the customer. In other cases, the assembly plant does not include the antenna mast with the vehicle as received at the dealership, therefore the dealer does not install the antenna mast.

Accordingly, it is desirable to provide methods and systems for detecting the installation of the antenna mast. In addition, it is desirable to provide methods and systems for detecting whether the installation of the antenna mast was correct. Furthermore, other desirable features and characteristics of the present invention will become apparent from the subsequent detailed description and the appended claims, taken in conjunction with the accompanying drawings and the foregoing technical field and background.

SUMMARY

Accordingly, methods and systems are provided for detecting whether at least one of an antenna mast and a detection mechanism is installed to an antenna. In one embodiment, a method includes monitoring at least one of amplitude modulation (AM) band data and direct current (DC) power data of the antenna; and selectively determining whether at least one of the antenna mast and the detection mechanism is installed based on the at least one of the AM band data and the DC power data.

In another embodiment, a system includes a first module and a second module. The first module monitors at least one of amplitude modulation (AM) band data and direct current (DC) power data of the antenna. The second module selectively determines whether at least one of the antenna mast and the detection mechanism is installed based on the at least one of the AM band data and the DC power data.

DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
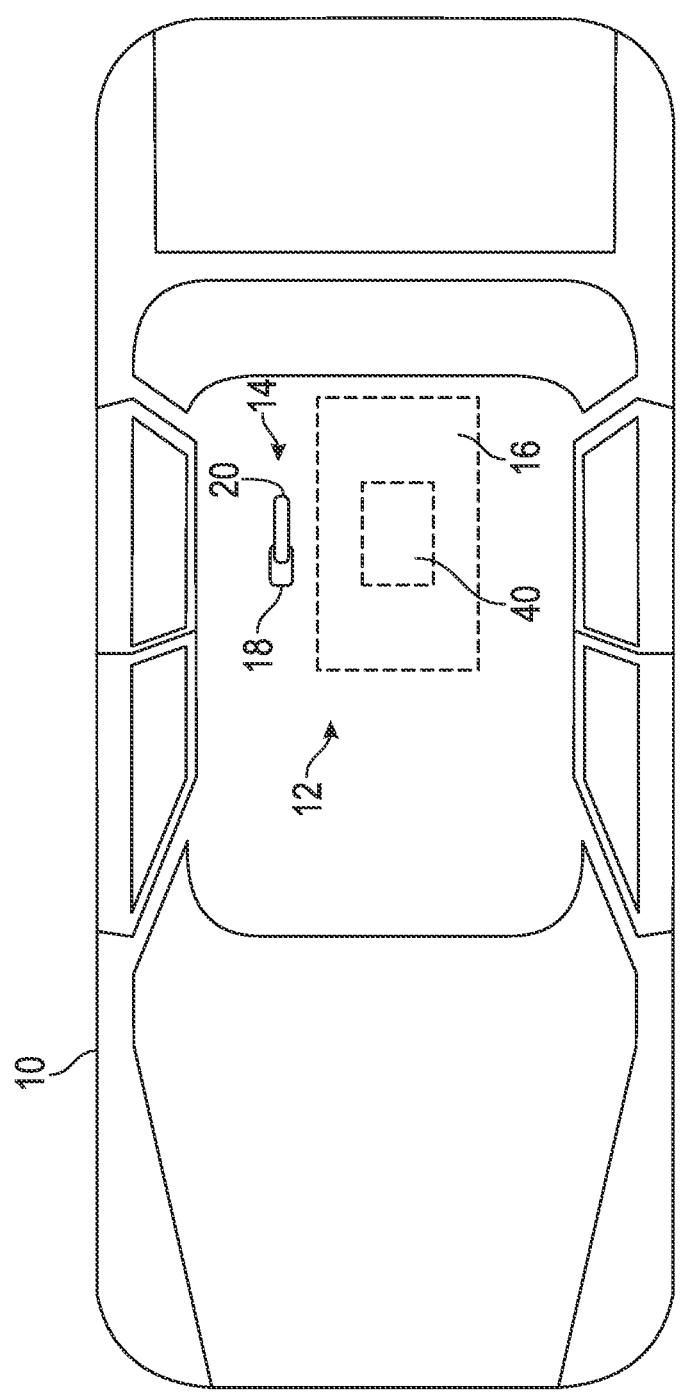
FIG. 1 is a diagram of a vehicle including an antenna monitoring system in accordance with various embodiments.

The following detailed description is merely exemplary in nature and is not intended to limit the application and uses. Furthermore, there is no intention to be bound by any expressed or implied theory presented in the preceding technical field, background, brief summary or the following detailed description. It should be understood that throughout the drawings, corresponding reference numerals indicate like or corresponding parts and features. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Referring now to FIG. 1, a vehicle 10 is shown having an antenna monitoring system shown generally at 12 in accordance with various embodiments. Although the figures shown herein depict an example with certain arrangements of elements, additional intervening elements, devices, features, or components may be present in an actual embodiments. It should also be understood that FIG. 1 is merely illustrative and may not be drawn to scale.

In FIG. 1, the vehicle monitoring system 10 is shown to include an antenna shown generally at 14 communicatively coupled to an infotainment system 16. The antenna 14, when completely installed to the vehicle 10, includes an antenna base 18 and an antenna mast 20. As can be appreciated, the antenna 14 can be any antenna type including, but not limited to, AM FM or multi-band antennas that include AM FM content. For exemplary purposes, the disclosure will be discussed in the context of a hexband antenna 14.

Figure 2:
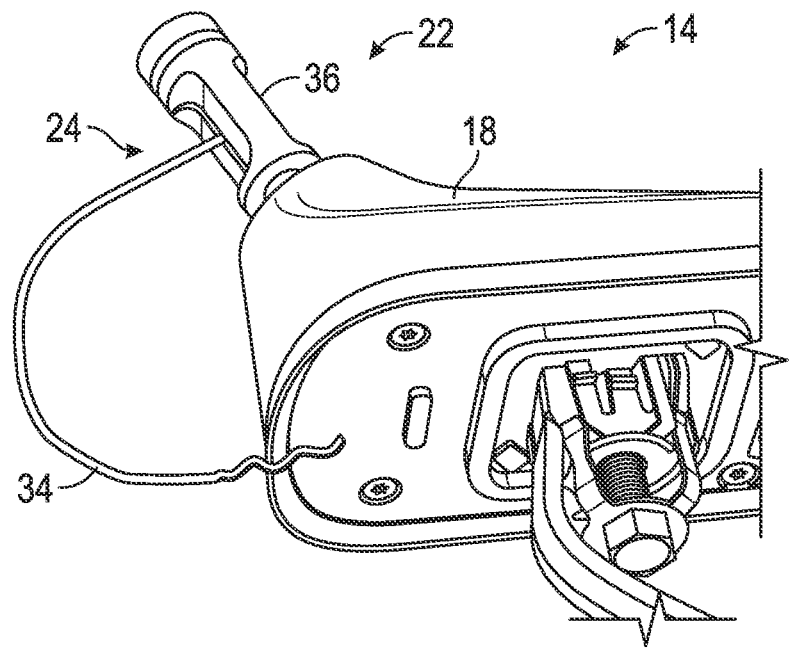
FIG. 2 is a perspective view of an antenna of the antenna system having a removable detection mechanism in accordance with various embodiments.

As shown in FIG. 2, prior to complete installation into the vehicle 10, a shipping cap 22 is removably coupled to the antenna base 18. When completing the installation of the antenna 14 to the vehicle 10, the shipping cap 22 is removed from the antenna base 18, and is replaced with the antenna mast 20 as shown in FIG. 3.

Figure 3:
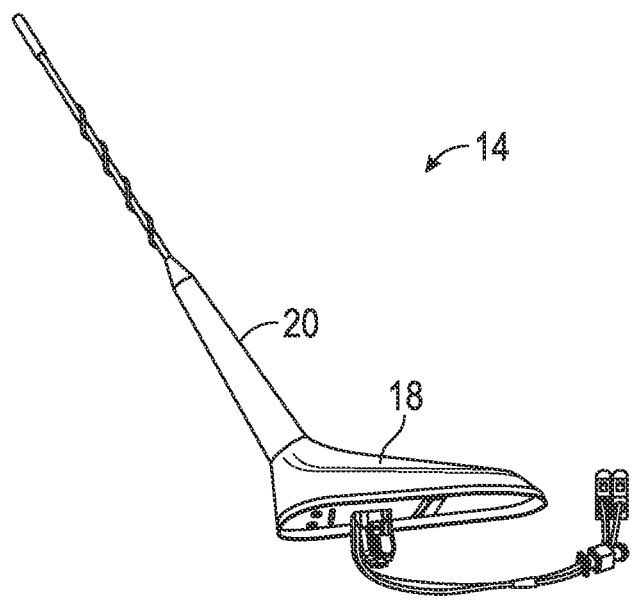
FIG. 3 is a perspective view of an antenna of the antenna system having an antenna mast installed in place of the removable detection mechanism in accordance with various embodiments.

As further shown in FIG. 2, the antenna 14 includes a detection mechanism shown generally at 24 for assisting in the detection of the installation of the antenna mast 20 (FIG. 3). The detection mechanism 24 is shown to be integrated with the shipping cap 22. As can be appreciated, in various other embodiments (not shown), the detection mechanism is implemented separate from the shipping cap 22 and/or installed in place of the shipping cap 22.

The detection mechanism 24 further includes a shunt element 34 that movably couples to and extends from a body 28 of the shipping cap 22. When the shipping cap 22 is installed to the antenna base 18, the shunt element 34 couples to a ground element (e.g., of the vehicle chassis) through the antenna base 18 (as shown in FIG. 2). When a contact is made between the shunt element 34 and the ground element, a no signal condition is created. In contrast, when no contact is made between the shunt element 34 and the ground element, a signal enable condition is created.

With reference back to FIG. 1, the infotainment system 16 includes an antenna monitoring module 40. In various other embodiments (not shown), the antenna monitoring module 40 communicates with (e.g., through a vehicle communication bus (not shown)) but is not part of the infotainment system 16. The antenna monitoring module 40 communicates with the antenna 14 to determine if the antenna mast 20 has been installed and/or whether the antenna mast 20 has been damaged.

Figure 4:
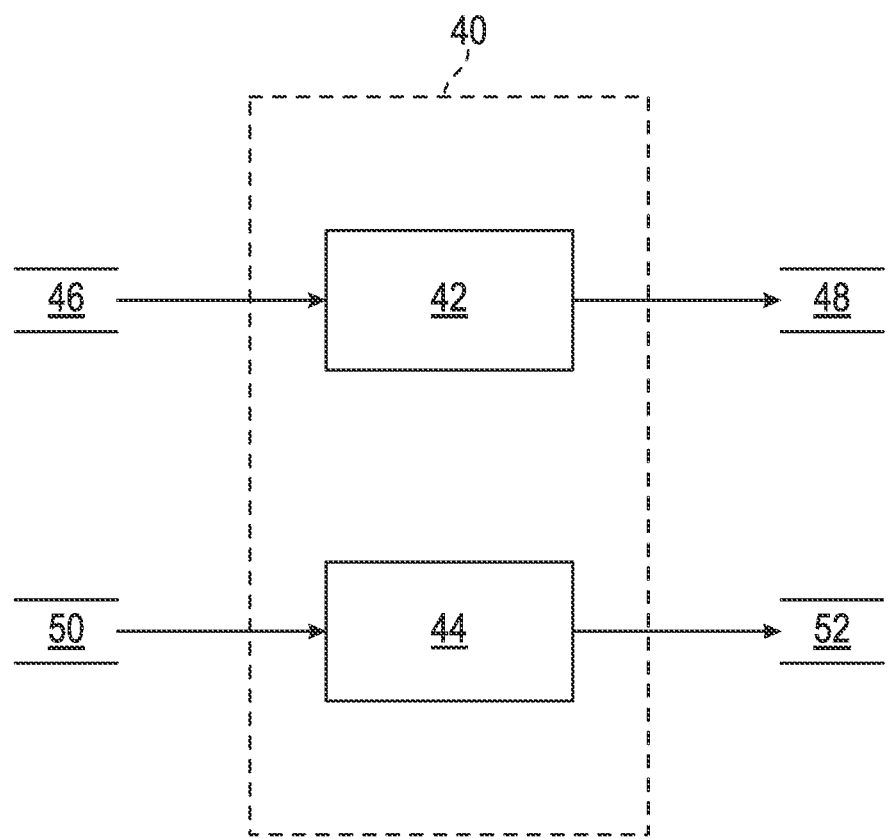
FIG. 4 is a dataflow diagram illustrating an antenna mast monitoring module in accordance with various embodiments.

Referring now to FIG. 4 and with continued reference to FIGS. 1-3, a dataflow diagram illustrates various embodiments of the antenna monitoring module 40 of the antenna monitoring system 12. Various embodiments of antenna monitoring modules 40 according to the present disclosure may include any number of sub-modules. As can be appreciated, the sub-modules shown in FIG. 4 may be combined and/or further partitioned to similarly monitor the antenna 14. Inputs to the antenna monitoring module 40 may be received from sensors, may be received from other modules that process sensed data, and or may be received from other control modules within the vehicle 10. In various embodiments, the antenna monitoring module 40 includes a mast detection module 42, and a mast health monitoring module 44.

The mast detection module 42 monitors various antenna data 46 to detect whether the antenna mast 20 has been installed. The mast detection module 42 generates warning signals 48 based on the monitoring. The warning signals 48 may be used to set a fault code of the vehicle 10, to illuminate a warning lamp of the vehicle 10, to generate an audible warning within the vehicle 10, and/or to display a warning message in the infotainment system 16 or other display system of the vehicle 10. In various embodiments, the monitoring methods performed by the mast detection module 42 may be performed as a scheduled test prior to delivery of the vehicle 10.

In various embodiments, the antenna data 46 includes amplitude modulation (AM) band data and the mast detection module 42 monitors the AM band data to determine whether the antenna mast 20 has been installed. For example, the mast health monitoring module 44 monitors the AM band data based on a monitoring method as shown in FIG. 6 (as will be discussed in more detail below).

In various other embodiments, the antenna data 46 includes direct current (DC) power data and the mast detection module 42 monitors the DC power data to determine whether the antenna mast 20 has been installed. For example, the mast health monitoring module 44 monitors the DC power level within the antenna frequency band using a data based method such as a monitoring method shown in FIG. 7 (as will be discussed in more detail below).

The mast health monitoring module 44 monitors various antenna data 50 to detect the health of the antenna including the antenna mast 20, cable, and cable connections. The mast health monitoring module 44 generates warning signals 52 based on the monitoring. The warning signals 52 may be used to set a fault code of the vehicle 10, to illuminate a warning lamp of the vehicle 10, to generate an audible warning within the vehicle 10, and/or to display a warning message in the infotainment system 16 or other display system of the vehicle 10. In various embodiments, the monitoring methods performed by the mast health monitoring module 44 may be performed as a scheduled test prior to delivery of the vehicle 10 and/or as a periodic test during operation of the vehicle 10 to detect a damaged antenna mast, or to detect whether the mast has been removed.

Figure 5:
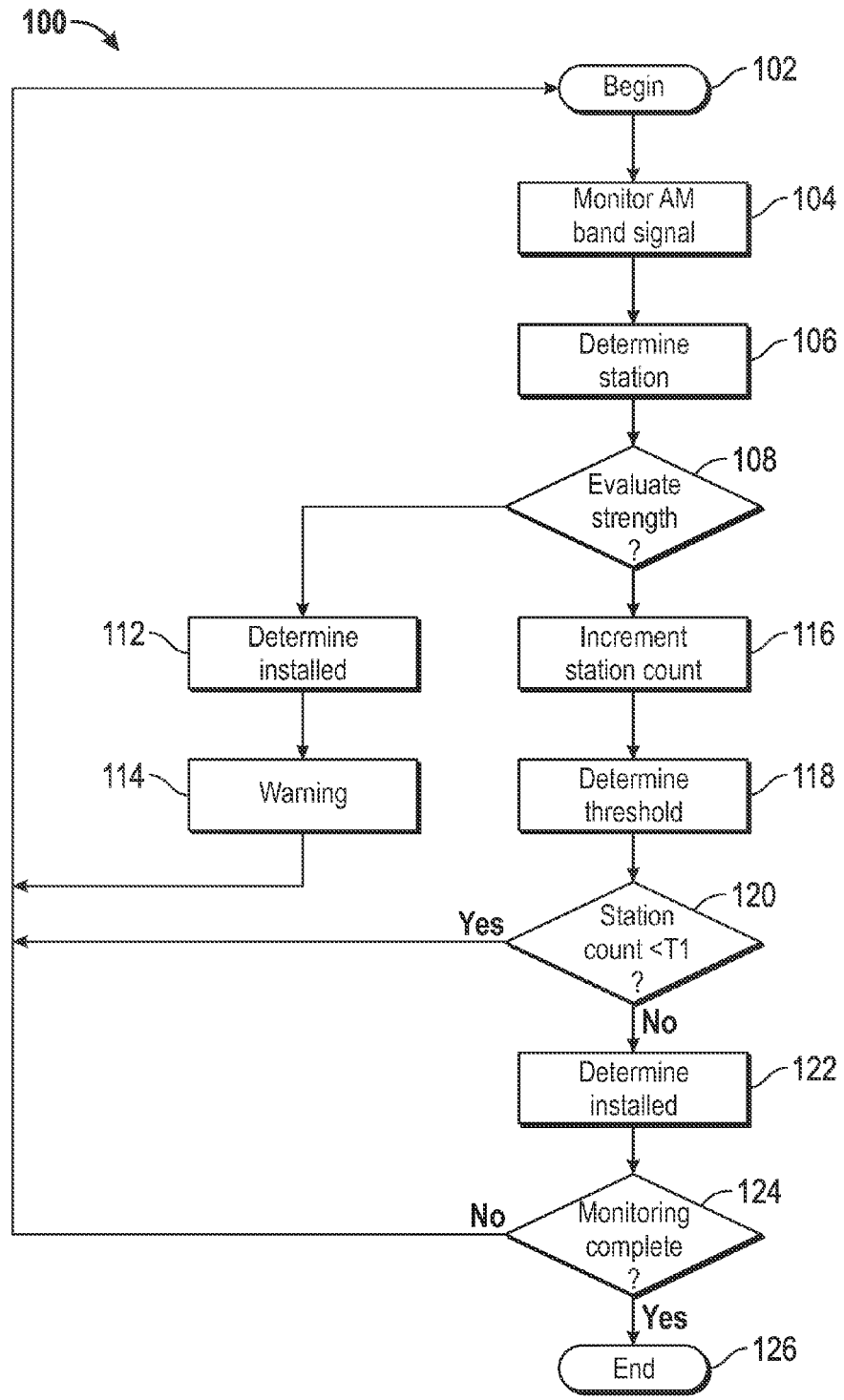
FIGS. 5 and 6 are flowcharts illustrating antenna mast monitoring methods in accordance with various embodiments.
Figure 6:
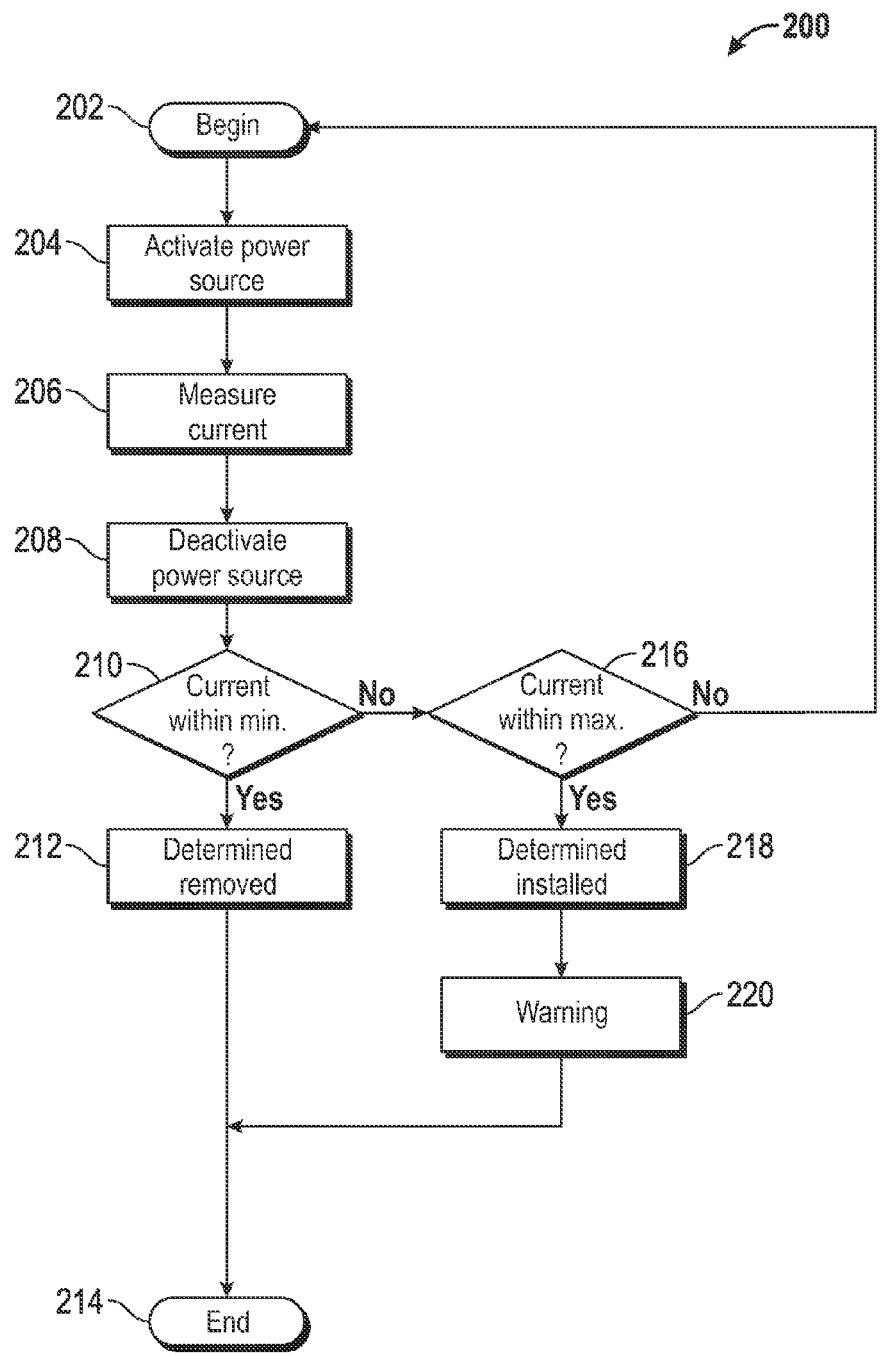

Referring now to FIGS. 5 and 6, and with continued reference to FIGS. 1-4, flowcharts illustrate monitoring methods 100, 200 that can be performed by the antenna monitoring module 40 in accordance with various embodiments. As can be appreciated in light of the disclosure, the order of operation within the methods is not limited to the sequential execution as illustrated in FIGS. 5 and 6, but may be performed in one or more varying orders as applicable and in accordance with the present disclosure. As can further be appreciated, one or more steps of the method may be added or deleted without altering the spirit of the method.

The monitoring method 100 of FIG. 5 monitors the amplitude modulation (AM) band data. With the detection mechanism 24 installed, the AM band signal reception is impeded through a short. In general, the method 100 determines a number of "strong" AM stations meeting a signal strength metric to determine whether the detection mechanism 24 has been removed and the antenna mast 20 has been installed.

In one example, the method begins at 102. The AM band signal is monitored at 104 and an AM station is determined at 106. The AM station signal strength is evaluated at 108. If the AM signal strength is less than or equal to a threshold at 108, the detection mechanism is determined to still be installed at 112 and a warning signal 48 is generated indicating such at 114. Thereafter, the method continues with monitoring the AM band signal at 104.

If, however, the AM signal strength is greater than a threshold at 108, a station count is incremented at 116. Optionally, a station count threshold is determined at 118 based on a location of the vehicle 10 (e.g., by GPS system data) and a time of day and is evaluated at 120. If the station count is less than the determined count threshold at 120, the method continues with monitoring the AM band signal at 104.

If the station count is greater than or equal to the determined count threshold at 120, the antenna mast 20 is determined to be installed at 122. If the monitoring is complete at 124, the method may end at 126. Otherwise, the method continues with monitoring the AM band signal at 104.

The monitoring method 200 of FIG. 6 monitors the DC power level data. With the detection mechanism 24 installed, the DC power is shorted. In general, the method 200 measures a current of the antenna 14 to determine whether the detection mechanism 24 has been removed and the antenna mast 20 has been installed. This method in general is best suited but not limited to passive antenna systems.

In one example, the method begins at 202. A phantom DC power source is activated at 204. Current is measured through the antenna 14 at 206. The DC power source is deactivated at 208. The measured current is evaluated at 210 and 216. If the current is within a range of a minimum value at 210, the detection mechanism 24 is determined to be removed at 212 and the method may end at 214. If however, the current is not within the range of the minimum value at 210, however the current is within a range of maximum value at 216, the detection mechanism 24 is determined to be installed at 218. The warning signals 48 are determined based thereon and generated at 220. Thereafter, the method may end at 214. If however, the current is not within the range of the maximum value at 216, the method may continue at 202.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method of detecting whether at least one of an antenna mast and a detection mechanism is installed to an antenna, comprising:
monitoring amplitude modulation (AM) band data of the antenna; and
selectively determining whether at least one of the antenna mast and the detection mechanism is installed based on the AM band data.

2. The method of claim 1, further comprising determining an AM station based on the AM band data, wherein the selectively determining is based on the AM band station.

3. The method of claim 2, further comprising evaluating a signal strength of the AM station, and wherein the selectively determining is based on the signal strength.

4. The method of claim 3, wherein the selectively determining comprises determining that the detection mechanism is installed based on the signal strength.

5. The method of claim 4, wherein the determining that the detection mechanism is installed comprises determining that the detection mechanism is installed when the signal strength is greater than a threshold.

6. The method of claim 4, further comprising generating a warning signal indicating that the detection mechanism is installed.

7. The method of claim 1, further comprising determining a station count based on the AM band data, and wherein the selectively determining is based on the station count.

8. The method of claim 7, further comprising determining a count threshold based on at least one of a global positioning system position and a time of day, and wherein the selectively determining is based on the count threshold.

9. The method of claim 7, wherein the selectively determining comprises determining that the antenna mast is installed based on the station count.

10. The method of claim 8, wherein the selectively determining comprises determining that the antenna mast is installed, and wherein the determining that the detection mechanism is installed comprises determining that the detection mechanism is installed when the station count is greater than the count threshold.

11. The method of claim 1, further comprising:
activating a direct current (DC) power source;
monitoring DC power data of the antenna;
measuring current through the antenna from the DC power source; and
deactivating the DC power source, and
wherein the DC power data is associated with the current.

12. The method of claim 11, further comprising comparing the DC power data to at least one of a minimum and a maximum value, and wherein the selectively determining is also based on the comparing.

13. The method of claim 12, wherein the comparing comprises comparing the DC power data to the minimum value, and wherein the selectively determining further comprises determining that the detection mechanism is not installed when the DC power data indicates that the current is within a range of the minimum value.

14. The method of claim 12, wherein the comparing comprises comparing the DC power data to the maximum value, and wherein the selectively determining further comprises determining that the detection mechanism is installed when the DC power data indicates that the current is within a range of the maximum value.

15. The method of claim 14, further comprising generating a warning signal indicating that the detection mechanism is installed.

16. The method of claim 15, wherein the warning signal at least one of sets a fault code of a vehicle 10, illuminates a warning lamp of the vehicle, generates an audible warning within the vehicle, and displays a warning message in a display system of the vehicle.

17. A system for detecting whether at least one of an antenna mast and a detection mechanism is installed to an antenna, comprising:
a first module that monitors amplitude modulation (AM) band data of the antenna; and
a second module selectively determines whether at least one of the antenna mast and the detection mechanism is installed based on the AM band data.

18. The system of claim 17, wherein the first module determines at least one AM station based on the AM band data, and wherein the second module selectively determines whether the at least one of the antenna mast and the detection mechanism is installed based on the at least one AM station.

19. The system of claim 17, wherein the antenna is a vehicle antenna and wherein the detection mechanism and the antenna mast removably couple to an antenna base of the vehicle antenna.

20. A system for detecting whether at least one of an antenna mast and a detection mechanism is installed to an antenna, comprising:
a first module that monitors at least one of amplitude modulation (AM) band data and direct current (DC) power data of the antenna; and
a second module selectively determines whether at least one of the antenna mast and the detection mechanism is installed based on the at least one of the AM band data and the DC power data;
wherein the antenna is a vehicle antenna and wherein the detection mechanism and the antenna mast removably couple to an antenna base of the vehicle antenna.

* * * * *